United States Patent [19]

Walsh et al.

[11] Patent Number: 5,430,855
[45] Date of Patent: Jul. 4, 1995

[54] DISK DRIVE ARRAY MEMORY SYSTEM USING NONUNIFORM DISK DRIVES

[75] Inventors: Robert Walsh; George A. Rudeseal, both of Boulder; Jay S. Belsan, Nederland, all of Colo.

[73] Assignee: Storage Technology Corporation, Louisville, Colo.

[21] Appl. No.: 299,247

[22] Filed: Aug. 31, 1994

Related U.S. Application Data

[63] Continuation of Ser. No. 651,575, Feb. 6, 1991, abandoned.

[51] Int. Cl.⁶ ............................................... G06F 3/00
[52] U.S. Cl. ............................... 395/275; 395/575; 395/500; 371/10.1; 364/DIG. 1; 364/236.2
[58] Field of Search ............... 395/575, 800, 500, 400, 395/425; 371/10.1, 10.2; 360/73.02, 73.03

[56] References Cited

U.S. PATENT DOCUMENTS

| | | | |
|---|---|---|---|
| 4,805,090 | 2/1989 | Coogan | 395/275 |
| 4,858,038 | 8/1989 | Kazama | 360/69 |
| 4,907,105 | 3/1990 | Kurweil, Jr. | 360/73.02 |
| 4,918,544 | 4/1990 | Ishizuka et al. | 360/73.03 |
| 4,928,192 | 5/1990 | Bartlett et al. | 360/77.08 |
| 4,931,924 | 6/1990 | Kaguera | 395/500 |
| 4,989,205 | 1/1991 | Dunphy, Jr. et al. | 371/10.1 |
| 5,077,736 | 12/1991 | Dunphy et al. | 371/10.1 |
| 5,101,492 | 3/1992 | Schultz et al. | 395/575 |

OTHER PUBLICATIONS

"Some Design Issues of Disk Array" Ng, 1989, IEEE pp. 137–142.

Primary Examiner—Alyssa H. Bowler
Assistant Examiner—L. Donaghue
Attorney, Agent, or Firm—Duft, Graziano & Forest

[57] ABSTRACT

The data storage subsystem is implemented using an array of data storage elements which vary in data storage characteristics and/or data storage capacity. Control apparatus automatically compensates for any nonuniformity among the data storage elements by selecting a set of physical characteristics that define a common data storage element format. The selected set of physical characteristics may not match any of the disk drives but each disk drive can emulate these selected characteristics. This capability enables the disk drives in the data storage subsystem to be replaced by nonidentical disk drives in a nondisruptive manner to provide continuous data availability.

48 Claims, 10 Drawing Sheets

DISK DRIVE ARRAY MEMORY SYSTEM USING NONUNIFORM DISK DRIVES

This application is a continuation of application Ser. No. 07/651,575, filed Feb. 06, 1991 now abandoned.

CROSS REFERENCE TO RELATED APPLICATIONS

This application is related to patent application Ser. No. 07/509,484, entitled Logical Track Write Scheduling System for a Parallel Disk Drive Array Data Storage Subsystem, filed Apr. 16, 1990, now U.S. Pat. No. 5,124,987.

FIELD OF THE INVENTION

This application relates to computer data storage systems and, in particular, to a parallel array of disk drives that is implemented using nonuniform disk drives.

PROBLEM

It is a problem in the field of computer memory systems to realize the most economical memory system without sacrificing either data access, speed or memory capacity. In computer memory systems, disk arrays are used to implement a large form factor disk drive using a plurality of small form factor disk drives. In such systems, a plurality of small form factor disk drives are configured into a one dimensional array, or a vector, to emulate the operation of a large form factor disk drive. This one dimensional array or vector of disk drives is typically called a redundancy group wherein there are n disk drives used to store data and m disk drives used to store redundancy information to thereby provide additional reliability to this memory system. Furthermore, a subset of r disk drives can be provided in a shared pool of spare disk drives to be switchably interconnected in place of one of the data or redundancy disk drives that fails during operation.

A difficulty with these arrangements is that all of the disk drives in the redundancy group must be identical in not only data storage capacity but also in their data storage configuration: number of tracks/cylinder, number of cylinders/drive, track capacity, etc. Any disparity, among the disk drives in a redundancy group, in these characteristics cannot be tolerated. In some of these arrangements with synchronized spindles, all disk drives must also be uniform in the data storage configuration characteristics of rotational speed and device data transfer rate.

SOLUTION

The above described problems are solved and a technical advance achieved in the field by the data storage subsystem of the present invention which uses an array of nonuniform small form factor disk drives configured into at least one large form factor disk drive. This data storage subsystem is implemented using an array of data storage elements which data storage elements may vary in data storage characteristics which include: data storage configuration and/or data storage capacity. Each data storage element is defined by not only its data storage capacity but also its data storage configuration, which is the set of physical characteristics representative of the device used as the data storage element. For example, a disk drive data storage configuration includes: number of tracks/cylinder, number of cylinders/drive, data transfer rate, track capacity, disk rotational speed, etc.

Control software and appropriate buffering are provided in the data storage subsystem to regulate the transfer of data between an associated host processor and the disk drives of the data storage subsystem. The disk drives are configured into a plurality of redundancy groups, each of which contains at least two disk drives. This control software automatically compensates for any nonuniformity among the data storage elements within each redundancy group by selecting each of the physical characteristics in the data storage configuration to define a uniform data storage element for the redundancy group. Even though this set of selected characteristics may not match the physical characteristics of any of the disk drives in the redundancy group, the defined uniform data storage element can be emulated by every disk drive in the redundancy group. This configuration enables the disk drives in the data storage subsystem to be replaced with nonidentical disk drives without encountering the architectural limitations of prior art systems.

DETAILED DESCRIPTION OF THE DRAWING

Figure 1:
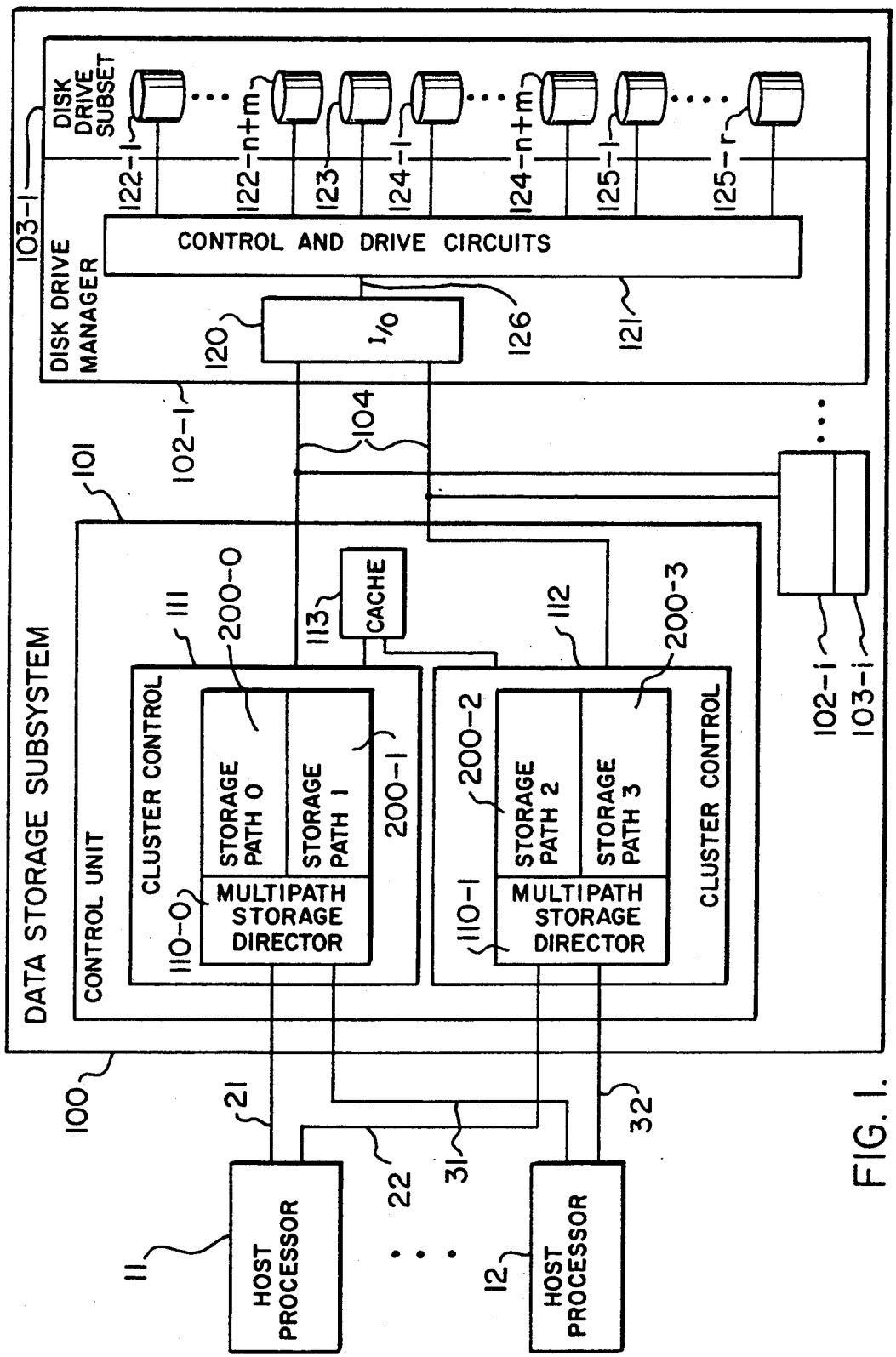
FIG. 1 illustrates in block diagram form the architecture of the disk drive array data storage subsystem.

The data storage subsystem of the present invention uses a plurality of small form factor disk drives in place of a single large form factor disk drive to implement an inexpensive, high performance, high reliability disk drive memory that emulates the format and capability of large form factor disk drives. This system avoids the parity update problem of the prior art by never updating the parity. Instead, all new or modified data is written on empty logical tracks and the old data is tagged as obsolete. The resultant "holes" in the logical tracks caused by old data are removed by a background free-space collection process that creates empty logical tracks by collecting valid data into previously emptied logical tracks.

The plurality of disk drives in the parallel disk drive array data storage subsystem are configured into a plurality of variable size redundancy groups of N+M parallel connected disk drives to store data thereon. Each redundancy group, also called a logical disk drive, is divided into a number of logical cylinders, each containing i logical tracks, one logical track for each of the i physical tracks contained in a cylinder of one physical disk drive. Each logical track is comprised of N+M physical tracks, one physical track from each disk drive in the redundancy group. The N+M disk drives are used to store N data segments, one on each of N physical tracks per logical track, and to store M redundancy segments, one on each of M physical tracks per logical track in the redundancy group. The N+M disk drives in a redundancy group have unsynchronized spindles and loosely coupled actuators. The data is transferred to the disk drives via independent reads and writes since all disk drives operate independently. Furthermore, the M redundancy segments, for successive logical cylinders, are distributed across all the disk drives in the redundancy group rather than using dedicated redundancy disk drives. The redundancy segments are distributed so that every actuator in a redundancy group is used to access some of the data segments stored on the disk drives. If dedicated drives were provided for redundancy segments, then these disk drives would be inactive unless redundancy segments were being read from or written to these drives. However, with distributed redundancy, all actuators in a redundancy group are available for data access. In addition, a pool of R globally switchable backup disk drives is maintained in the data storage subsystem to automatically substitute a replacement disk drive for a disk drive in any redundancy group that fails during operation. The pool of R backup disk drives provides high system reliability at low cost.

Each physical disk drive is designed so that it can detect a failure in its operation, which allows the M redundancy segments per logical track to be used for multi-bit error correction. Identification of the failed physical disk drive provides information on the bit position of the errors in the logical track and the redundancy data provides information to correct the errors. Once a failed disk drive in a redundancy group is identified, a backup disk drive from the shared pool of backup disk drives is automatically switched in place of the failed disk drive. Control circuitry reconstructs the data stored on each physical track of the failed disk drive, using the remaining N−1 physical tracks of data plus the associated M physical tracks containing redundancy segments of each logical track. A failure in the redundancy segments does not require data reconstruction, but necessitates regeneration of the redundancy information. The reconstructed data is then written onto the substitute disk drive. The use of backup disk drives increases the system reliability of the N+M parallel disk drive architecture while the use of a shared pool of backup disk drives minimizes the cost of providing the improved reliability.

The disk drive array data storage subsystem includes data storage management apparatus that provides improved data storage and retrieval performance by dynamically mapping between virtual and physical data storage devices. The disk drive array data storage subsystem consists of three abstract layers: virtual, logical and physical. The virtual layer functions as a conventional large form factor disk drive memory. The logical layer functions as an array of storage units that are grouped into a plurality of redundancy groups, each containing N+M physical disk drives. The physical layer functions as a plurality of individual small form factor disk drives. The data storage management system operates to effectuate the dynamic mapping of data among these abstract layers and to control the allocation and management of the actual space on the physical devices. These data storage management functions are performed in a manner that renders the operation of the disk drive array data storage subsystem transparent to the host processor which perceives only the virtual image of the disk drive array data storage subsystem.

In order to enable different types of drives to be used in the data storage subsystem, the data storage management apparatus maps all disk drives in a redundancy group into a common drive format. Each disk drive in the redundancy group is defined by its data storage characteristics which include not only its data storage capacity but also its data storage configuration, which is the set of physical characteristics representative of the disk drive, including: number of tracks/cylinder, number of cylinders/drive, data transfer rate, track capacity, disk rotational speed, etc. The control apparatus selects a common drive format representative of a set of physical characteristics that can be emulated by all of the disk drives in the redundancy group. For example, this common drive format can include the lowest usable track capacity of any disk drive in the redundancy group and the lowest number of usable tracks of any disk drive in the redundancy group. This common drive format typically matches the physical characteristics of the lowest capacity disk drive in the redundancy group, although it may not match the physical characteristics of any disk drive in the redundancy group. This common drive format is used as a template which is used to map the physical tracks of all the remaining disk drives into a common uniform drive format across the redundancy group. This capability also extends to the pool of backup disk drives and enables a single pool of disk drives, having diverse physical characteristics, to be used for all redundancy groups in the data storage subsystem.

The performance of this system is enhanced by the use of a cache memory with both volatile and nonvolatile portions and "backend" data staging and destaging processes. Data received from the host processors is stored in the cache memory in the form of modifications to data already stored in the redundancy groups of the data storage subsystem. No data stored in a redundancy group is modified. A virtual track is staged from a redundancy group into cache. The host then modifies some, perhaps all, of the records on the virtual track. Then, as determined by cache replacement algorithms such as Least Recently Used, etc, the modified virtual track is selected to be destaged to a redundancy group. When thus selected, a virtual track is divided (marked off) into several physical sectors to be stored on one or more physical tracks of one or more logical tracks. A complete physical track may contain physical sectors from one or more virtual tracks. Each physical track is combined with N−1 other physical tracks to form the N data segments of a logical track.

The original, unmodified data is simply flagged as obsolete. Obviously, as data is modified, the redundancy groups increasingly contain numerous virtual tracks of obsolete data. The remaining valid virtual tracks in a logical cylinder are read to the cache memory in a background "free space collection" process. They are then written to a previously emptied logical cylinder and the "collected" logical cylinder is tagged as being empty. Thus, all redundancy data creation, writing and free space collection occurs in background, rather than on-demand processes. This arrangement avoids the parity update problem of existing disk array systems and improves the response time versus access rate performance of the data storage subsystem by transferring these overhead tasks to background processes.

Data Storage Subsystem Architecture

FIG. 1 illustrates in block diagram form the architecture of a disk drive array 100. The disk drive array 100 appears to the associated host processors 11-12 to be a collection of large form factor disk drives with their associated storage control, since the architecture of disk drive array 100 is transparent to the associated host processors 11-12. This disk drive array 100 includes a plurality of disk drives (ex 122-1 to 125-r) located in a plurality of disk drive subsets 103-1 to 103-i. The disk drives 122-1 to 125-r are significantly less expensive, even while providing disk drives to store redundancy information and providing disk drives for backup purposes, than the typical 14 inch form factor disk drive with an associated backup disk drive. The plurality of disk drives 122-1 to 125-r are typically the commodity hard disk drives in the 5¼ inch form factor.

The architecture illustrated in FIG. 1 is that of a plurality of host processors 11-12 interconnected via the respective plurality of data channels 21, 22-31, 32, respectively to a data storage subsystem 100 that provides the backend data storage capacity for the host processors 11-12. This basic configuration is well known in the data processing art. The disk drive array 100 includes a control unit 101 that serves to interconnect the subsets of disk drives 103-1 to 103-i and their associated drive managers 102-1 to 102-i with the data channels 21-22, 31-32 that interconnect disk drive array 100 with the plurality of host processors 11, 12.

Control unit 101 includes typically two cluster controls 111, 112 for redundancy purposes. Within a cluster control 111 the multipath storage director 110-0 provides a hardware interface to interconnect data channels 21, 31 to cluster control 111 contained in control unit 101. In this respect, the multipath storage director 110-0 provides a hardware interface to the associated data channels 21, 31 and provides a multiplex function to enable any attached data channel ex-21 from any host processor ex-11 to interconnect to a selected cluster control 111 within control unit 101. The cluster control 111 itself provides a pair of storage paths 201-0, 201-1 which function as an interface to a plurality of optical fiber backend channels 104. In addition, the cluster control 111 includes a data compression function as well as a data routing function that enables cluster control 111 to direct the transfer of data between a selected data channel 21 and cache memory 113, and between cache memory 113 and one of the connected optical fiber backend channels 104. Control unit 101 provides the major data storage subsystem control functions that include the creation and regulation of data redundancy groups, reconstruction of data for a failed disk drive, switching a spare disk drive in place of a failed disk drive, data redundancy generation, logical device space management, and virtual to logical device mapping. These subsystem functions are discussed in further detail below.

Disk drive manager 102-1 interconnects the plurality of commodity disk drives 122-1 to 125-r included in disk drive subset 103-1 with the plurality of optical fiber backend channels 104. Disk drive manager 102-1 includes an input/output circuit 120 that provides a hardware interface to interconnect the optical fiber backend channels 104 with the data paths 126 that serve control and drive circuits 121. Control and drive circuits 121 receive the data on conductors 126 from input/output circuit 120 and convert the form and format of these signals as required by the associated commodity disk drives in disk drive subset 103-1. In addition, control and drive circuits 121 provide a control signalling interface to transfer signals between the disk drive subset 103-1 and control unit 101.

The data that is written onto the disk drives in disk drive subset 103-1 consists of data that is transmitted from an associated host processor 11 over data channel 21 to one of cluster controls 111, 112 in control unit 101. The data is written into, for example, cluster control 111 which stores the data in cache 113. Cluster control 111 stores N physical tracks of data in cache 113 and then generates M redundancy segments for error correction purposes. Cluster control 111 then selects a subset of disk drives (122-1 to 122-n+m) to form a redundancy group to store the received data. Cluster control 111 selects an empty logical track, consisting of N+M physical tracks, in the selected redundancy group. Each of the N physical tracks of the data are written onto one of N disk drives in the selected data redundancy group. An additional M disk drives are used in the redundancy group to store the M redundancy segments. The M redundancy segments include error correction characters and data that can be used to verify the integrity of the N physical tracks that are stored on the N disk drives as well as to reconstruct one or more of the N physical tracks of the data if that physical track were lost due to a failure of the disk drive on which that physical track is stored.

Thus, disk drive array 100 can emulate one or more large form factor disk drives (ex—an IBM 3380K type of disk drive) using a plurality of smaller form factor disk drives while providing a high reliability capability by writing the data across a plurality of the smaller form factor disk drives. A reliability improvement is also obtained by providing a pool of R backup disk drives (125-1 to 125-r) that are switchably interconnectable in place of a failed disk drive. Data reconstruction is accomplished by the use of the M redundancy segments, so that the data stored on the remaining functioning disk drives combined with the redundancy information stored in the redundancy segments can be used by control software in control unit 101 to reconstruct the data lost when one or more of the plurality of disk drives in the redundancy group fails (122-1 to 122-n+m). This arrangement provides a reliability capability similar to that obtained by disk shadowing arrangements at a significantly reduced cost over such an arrangement.

Disk Drive

Each of the disk drives 122-1 to 125-r in disk drive subset 103-1 can be considered a disk subsystem that consists of a disk drive mechanism and its surrounding control and interface circuitry. The disk drive consists of a commodity disk drive which is a commercially available hard disk drive of the type that typically is used in personal computers. A control processor associated with the disk drive has control responsibility for the entire disk drive and monitors all information routed over the various serial data channels that connect each disk drive 122-1 to 125-r to control and drive circuits 121. Any data transmitted to the disk drive over these channels is stored in a corresponding interface buffer which is connected via an associated serial data channel to a corresponding serial/parallel converter circuit. A disk controller is also provided in each disk drive to implement the low level electrical interface required by the commodity disk drive. The commodity disk drive has an ESDI interface which must be interfaced with control and drive circuits 121. The disk controller provides this function. Disk controller provides serialization and deserialization of data, CRC/ECC generation, checking and correction, NRZ data encoding, and speed matching to accommodate different data transfer rates and spin speeds. The addressing information such as the head select and other type of control signals are provided by control and drive circuits 121 to commodity disk drive 122-1. This communication path is also provided for diagnostic and control purposes. For example, control and drive circuits 121 can power a commodity disk drive down when the disk drive is in the standby mode. In this fashion, commodity disk drive remains in an idle state until it is selected by control and drive circuits 121.

Control Unit

Figure 2:
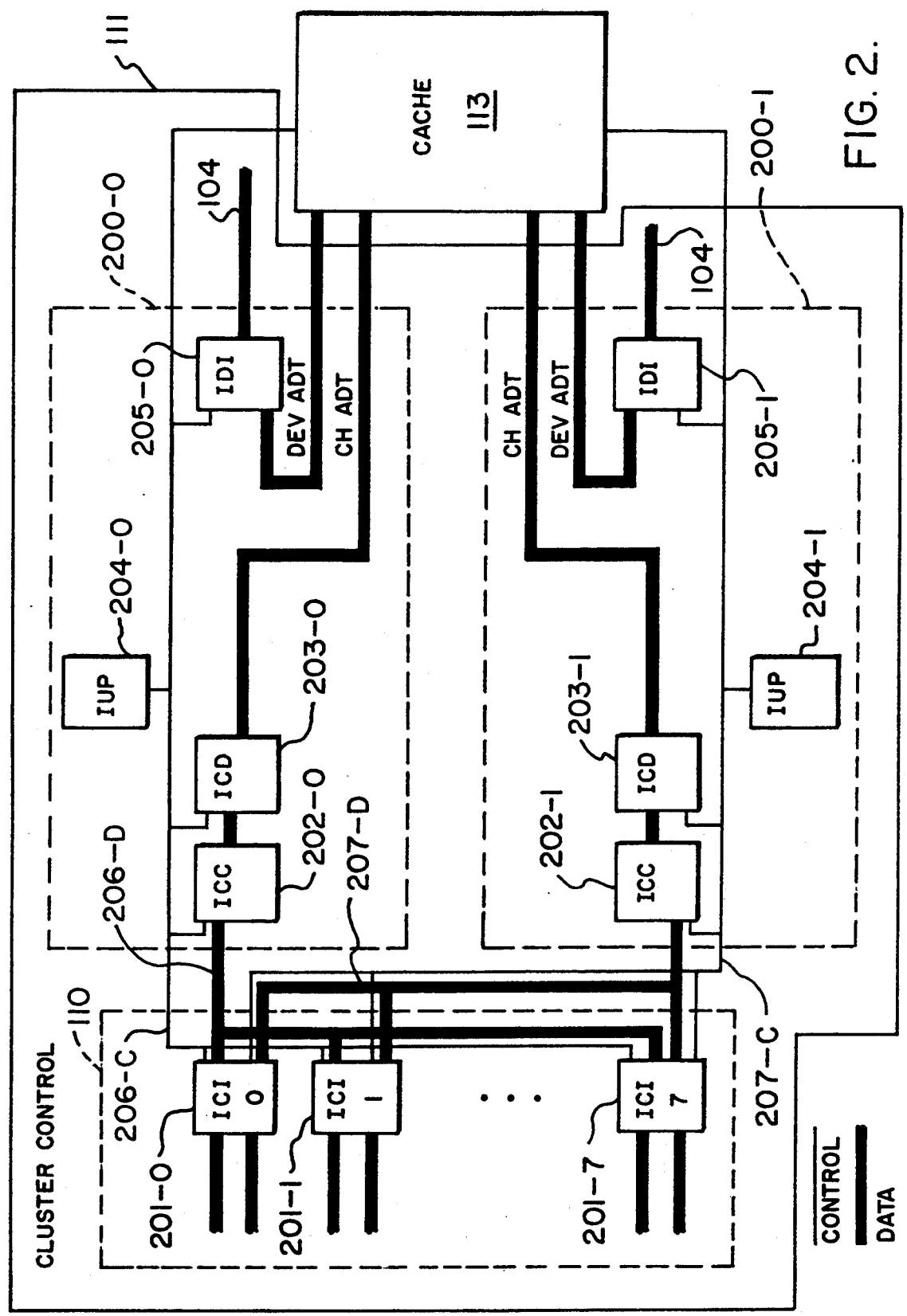
FIG. 2 illustrates the cluster control of the data storage subsystem.

FIG. 2 illustrates in block diagram form additional details of cluster control 111. Multipath storage director 110 includes a plurality of channel interface units 201-0 to 201-7, each of which terminates a corresponding pair of data channels 21, 31. The control and data signals received by the corresponding channel interface unit 201-0 are output on either of the corresponding control and data buses 206-C, 206-D, or 207-C, 207-D, respectively, to either storage path 200-0 or storage path 200-1. Thus, as can be seen from the structure of the cluster control 111 illustrated in FIG. 2, there is a significant amount of symmetry contained therein. Storage path 200-0 is identical to storage path 200-1 and only one of these is described herein. The multipath storage director 110 uses two sets of data and control busses 206-D, C and 207-D, C to interconnect each channel interface unit 201-0 to 201-7 with both storage path 200-0 and 200-1 so that the corresponding data channel 21 from the associated host processor 11 can be switched via either storage path 200-0 or 200-1 to the plurality of optical fiber backend channels 104. Within storage path 200-0 is contained a processor 204-0 that regulates the operation of storage path 200-0. In addition, an optical device interface 205-0 is provided to convert between the optical fiber signalling format of optical fiber backend channels 104 and the metallic conductors contained within storage path 200-0. Channel interface control 202-0 operates under control of processor 204-0 to control the flow of data to and from cache memory 113 and one of the channel interface units 201 that is presently active with storage path 200-0. The channel interface control 202-0 includes a cyclic redundancy check (CRC) generator/checker to generate and check the CRC bytes for the received data. The channel interface circuit 202-0 also includes a buffer that compensates for speed mismatch between the data transmission rate of the data channel 21 and the available data transfer capability of the cache memory 113. The data that is received by the channel interface control circuit 202-0 from a corresponding channel interface circuit 201 is forwarded to the cache memory 113 via channel data compression circuit 203-0. The channel data compression circuit 203-0 provides the necessary hardware and microcode to perform compression of the channel data for the control unit 101 on a data write from the host processor 11. It also performs the necessary decompression operation for control unit 101 on a data read operation by the host processor 11.

As can be seen from the architecture illustrated in FIG. 2, all data transfers between a host processor 11 and a redundancy group in the disk drive subsets 103 are routed through cache memory 113. Control of cache memory 113 is provided in control unit 101 by processor 204-0. The functions provided by processor 204-0 include initialization of the cache directory and other cache data structures, cache directory searching and management, cache space management, cache performance improvement algorithms as well as other cache control functions. In addition, processor 204-0 creates the redundancy groups from the disk drives in disk drive subsets 103 and maintains records of the status of those devices. Processor 204-0 also causes the redundancy data across the N data-disks in a redundancy group to be generated within cache memory 113 and writes the M segments of redundancy data onto the M redundancy disks in the redundancy group. The functional software in processor 204-0 also manages the mappings from virtual to logical and from logical to physical devices. The tables that describe this mapping are updated, maintained, backed up and occasionally recovered by this functional software on processor 204-0. The free space collection function is also performed by processor 204-0 as well as management and scheduling of the optical fiber backend channels 104. Many of these above functions are well known in the data processing art and are not described in any detail herein.

Disk Drive Manager

Figure 3:
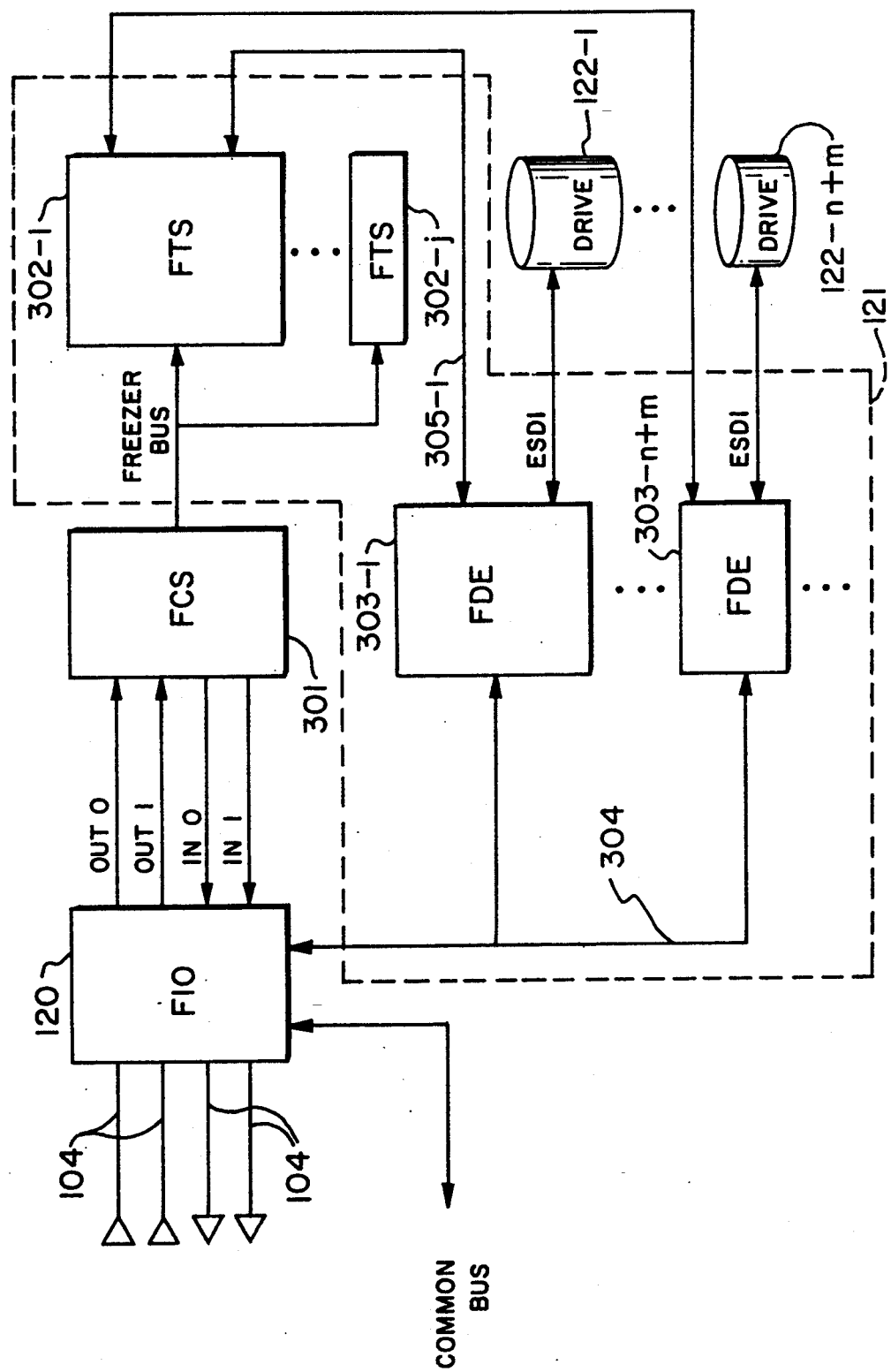
FIG. 3 illustrates the disk drive manager.

FIG. 3 illustrates further block diagram detail of disk drive manager 102-1. Input/output circuit 120 is shown connecting the plurality of optical fiber channels 104 with a number of data and control busses that interconnect input/output circuit 120 with control and drive circuits 121. Control and drive circuits 121 consist of a command and status circuit 301 that monitors and controls the status and command interfaces to the control unit 101. Command and status circuit 301 also collects data from the remaining circuits in disk drive managers 102 and the various disk drives in disk drive subsets 103 for transmission to control unit 101. Control and drive circuits 121 also include a plurality of drive electronics circuits 303, one for each of the commodity disk drives that is used in disk drive subset 103-1. The drive electronics circuits 303 control the data transfer to and from the associated commodity drive via an ESDI interface. The drive electronics circuit 303 is capable of transmitting and receiving frames on the serial interface and contains a microcontroller, track buffer, status and control registers and industry standard commodity drive interface. The drive electronics circuit 303 receives data from the input/output circuit 120 via an associated data bus 304 and control signals via control leads 305. Control and drive circuits 121 also include a plurality of subsystem circuits 302-1 to 302-j, each of which controls a plurality of drive electronics circuits 303. The subsystem circuit 302 controls the request, error and spin up lines for each drive electronics circuit 303. Typically, a subsystem circuit 302 interfaces with thirty-two drive electronics circuits 303. The subsystem circuit 302 also functions to collect environmental sense information for transmission to control unit 101 via command and status circuit 301. Thus, the control and drive circuits 121 in disk drive manager 102-1 perform the data and control signal interface and transmission function between the commodity disk drives of disk drive subset 103-1 and control unit 101.

Command and Status Circuit

Figure 4:
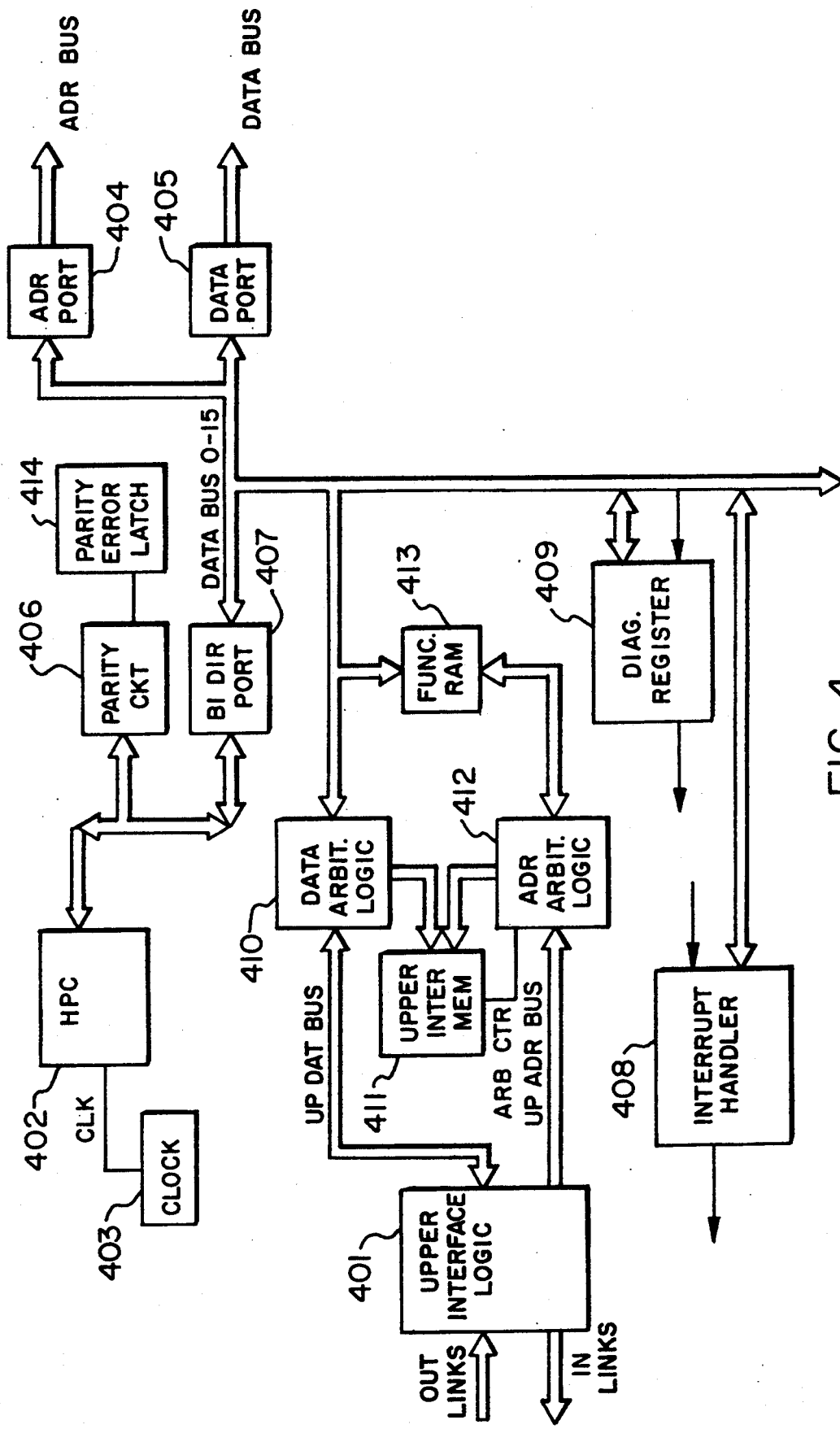
FIG. 4 illustrates the disk drive manager control circuit.

The command and status circuit 301 is illustrated in further detail in FIG. 4. The circuit has three main functions: collect status from the various subsystem circuits 302, report status to control unit 101 and provide diagnostics for disk drive manager 102-1. Command and status circuit 301 is controlled by a processor 402 and its associated clock 403. Processor 402 communicates with the address and data busses via ports 404 and 405 respectively. The direction of communication between processor and the busses and the remaining circuits in command and status circuit 301 is controlled by bidirectional port 407 which acts as an arbiter to regulate access to the internal bus of command and status circuit 301. Similarly, data and address arbitration logic circuits 410 and 412 regulate the access of the interface circuit 401 to the internal data bus of command and status circuit 301. For example, data received from input/output circuit 120 is received by the interface circuit 401 which stores this data in memory 411 via address and data busses that are connected between interface circuit 401 and the data and address arbitration logic 410 and 412. These arbitration circuits regulate access to memory 411 from the internal data bus of command and status circuit 301 and interface circuit 401. Similarly, processor 402 can access the data stored in memory 411 via the internal data bus of command and status circuit 301 and the corresponding data and address arbitration logic 410, 412. This data retrieved by processor 402 can then be output via address and data busses to the subsystem circuits 302 via address and data ports 404, 405 respectively.

Command and status circuit 301 includes interrupt handler 408. All interrupts in disk drive manager 102-1, except for reset, are brought through interrupt handler 408. Interrupt handler 408 collects all interrupts of a particular class which interrupts are read by interrupt software in processor 402. The interrupt software reads the memory mapped space in interrupt handler 408 to determine the bit pattern which indicates what interrupt has occurred.

Drive Electronics Circuit

Figure 5:
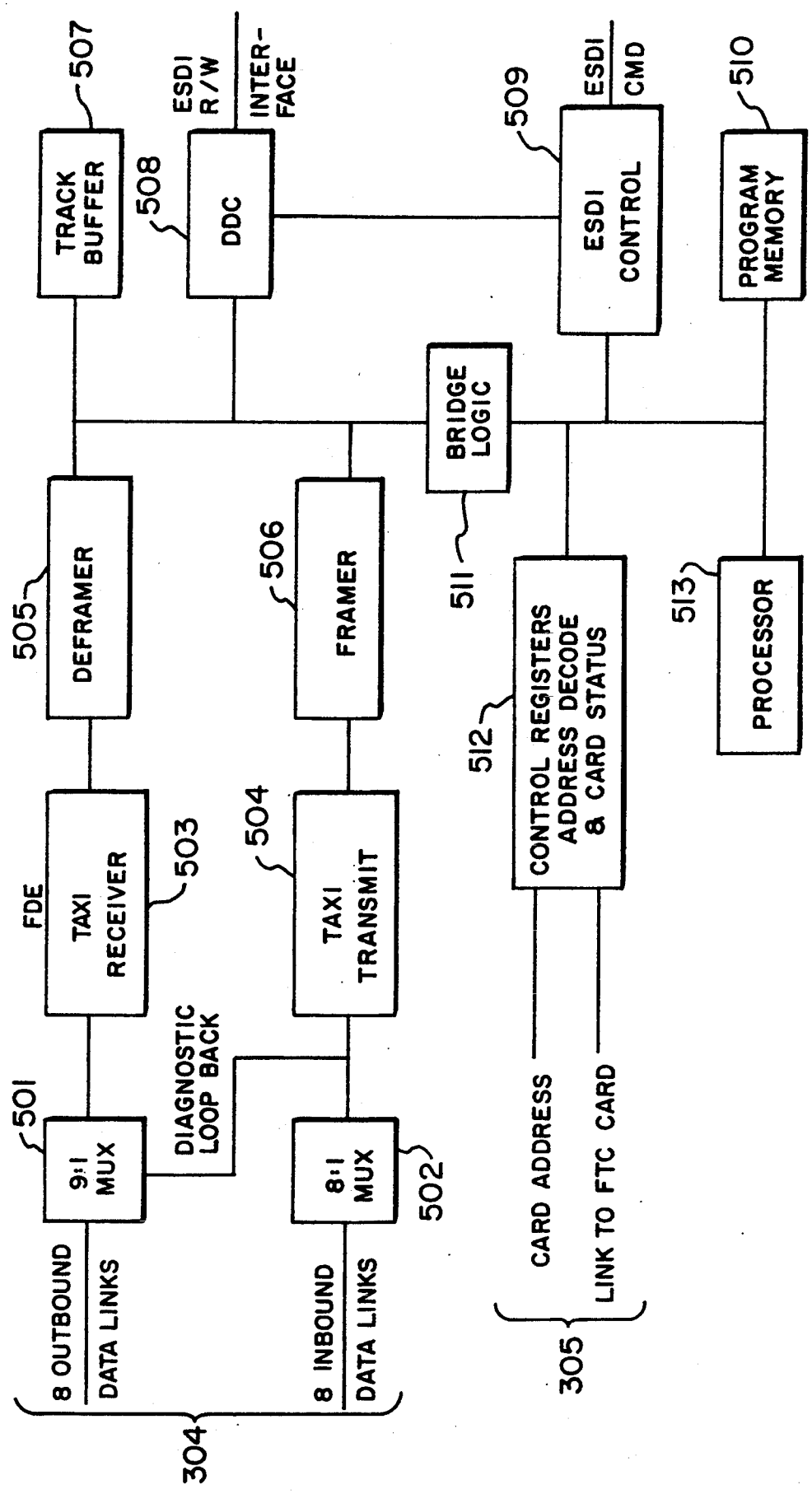
FIG. 5 illustrates the disk drive manager disk control electronics.

The drive electronics circuit 303 functions as an interface between the serial data links 304 that interconnect the input/output circuit 120 and the industry standard commodity disk drive such as drive 122-1. FIG. 5 illustrates additional details of drive electronics circuit 303. The serial data links 304 consist of eight outbound data links and eight inbound data links that are coupled via multiplexers 501 and 502 respectively to the internal circuitry of drive electronics circuit 303. Receiver 503 monitors the outbound data links and converts the information received from input/output circuit 120 into a parallel format for use by deframer circuit 505. Deframer circuit 505 checks if the destination address field in the received frame correlates with the drive electronics circuit's preprogrammed selection address. If the addresses are the same, deframer circuit 505 determines if the information being transmitted is data or a command, then stores the information in track buffer 507 using one of two DMA pointers, one for data storage and the other for command storage. Track buffer circuit 507 is capable of storing one complete physical track of information for transmission to the associated commodity disk drive 122-1. Deframer circuit 505 generates an interrupt when the transfer of a physical track of information is completed. The interrupt generated by deframer 505 is transmitted to processor 513, which interprets the command or data stored in track buffer 507 and acts accordingly. The track buffer 507 matches the data rate of the specific drive, makes the subsystem independent of device spin speed and data transfer rate. If processor 513 determines that the command is a data transfer command it initializes the control registers 512 for the data transfer. Processor 513 also activates ESDI control circuit 509 which provides the physical interface between the associated commodity disk drive 122-1 and the internal circuit of drive electronics circuit 303-1. Processor 513 also activates disk data controller circuit 508 which functions to interface commodity disk drives with microprocessor controlled systems. The disk data controller 508 is responsible for the data transfer from track buffer 507 to the ESDI control circuit 509. Therefore, the data path is from track buffer 507 through disk data controller 508 and ESDI control circuit 509 to the commodity disk drive 122-1. The ESDI control circuit 509 simply provides the electrical interface between drive electronics circuit 303-1 and disk drive 122-1.

Data transfers from the disk drive 122-1 to input/output circuit 120 are accomplished in similar fashion. The data is read by processor 513 in response to a request for a data read from control unit 101 by addressing the data on disk drive 122-1 via ESDI control circuit 509. The data read from drive 122-1 is routed through ESDI control circuit 509 and disk data controller 508 to track buffer 507 where it is stored until a complete physical track or a meaningful part thereof is stored therein. Framer 506 retrieves the physical track from track buffer 507 and formats and frames this physical track and forwards it to transmitter circuit 504. Transmitter circuit 504 transmits the frames serially through one of the eight inbound data links via multiplexer 502 to input/output circuit 120.

Disk Drive Malfunction

The control unit 101 determines whether an individual disk drive in the redundancy group it is addressing has malfunctioned. The control unit 101 that has detected a bad disk drive transmits a control message to disk drive manager 102-1 over the corresponding control signal lead to indicate that a disk drive has failed. When the need for a spare disk drive is detected by the control unit 101, the faulty disk drive is taken out of service and a spare disk drive 125-1 is activated from the spare pool of R disk drives (125-1 to 125-r) by the disk drive manager 102-1, at the request of control unit 101. This is accomplished by rewriting the configuration definition of that redundancy group that contained the bad disk drive. The new selected disk drive 125-1 in the redundancy group (122-1 to 122-$n+m$) is identified by control signals which are transmitted to all of cluster control 111-112. This insures that the system mapping information stored in each of cluster controls 111-112 is kept up to date.

Once the new disk drive (125-1) is added to the redundancy group (122-1 to 122-$n+m$), it is tested and, if found to be operating properly, it replaces the failed disk drive in the system mapping tables. The control unit 101 that requested the spare disk drive (125-1) reconstructs the data for the new disk drive (125-1) using the remaining N−1 operational data disk drives and the available redundancy information from the M redundancy disk drives. Before reconstruction is complete on the disk, data is still available to the host processors 11, 12, although it must be reconstructed on line rather than just reading it from a single disk. When this data reconstruction operation is complete, the reconstructed segments are written on the replacement disk drive (125-1) and the redundancy group is again fully operational.

This dynamically reconfigurable attribute of the disk drive array 100 enables this system to be very robust. In addition, the dynamically configurable aspect of the communication path between the cluster controls 111, 112 and the disk drives (122-1) permits the architecture to be very flexible. With the same physical disk drive subset (103-1), the user can implement a disk drive memory that has a high data storage capacity and which requires shorter periodic repair intervals, or a disk drive memory that has a lower data storage capacity with longer required repair intervals simply by changing the number of active disk drives in each redundancy group. In addition, the disk drive memory has the ability to detect new spare disk drives 123 when they are plugged in to the system thereby enabling the disk drive memory to grow as the storage or reliability needs change without having to reprogram the disk drive memory control software.

Dynamic Virtual Device to Logical Device Mapping

With respect to data transfer operations, all data transfers go through cache memory 113. Therefore, front end or channel transfer operations are completely independent of backend or device transfer operations. In this system, staging operations are similar to staging in other cached disk subsystems but destaging transfers are collected into groups for bulk transfers. In addition, this disk drive array 100 simultaneously performs free space collection, mapping table backup, and error recovery as background processes. Because of the complete front end/backend separation, the disk drive array 100 is liberated from the exacting processor timing dependencies of previous count key data disk subsystems. The subsystem is free to dedicate its processing resources to increasing performance through more intelligent scheduling and data transfer control.

The disk drive array 100 consists of three abstract layers: virtual, logical and physical. The virtual layer functions as a conventional large form factor disk drive memory. The logical layer functions as an array of storage units that are grouped into a plurality of redundancy groups (ex 122-1 to 122-$n+m$), each containing N+M disk drives to store N physical tracks of data and M physical tracks of redundancy information for each logical track. The physical layer functions as a plurality of individual small form factor disk drives. The data storage management system operates to effectuate the mapping of data among these abstract layers and to control the allocation and management of the actual space on the physical devices. These data storage management functions are performed in a manner that renders the operation of the disk drive array 100 transparent to the host processors (11-12).

A redundancy group consists of N+M disk drives. The redundancy group is also called a logical volume or a logical device. Each physical disk drive is used according to the common drive format for the logical device of which it is a part. Within each logical device there are a plurality of logical tracks, each of which is the set of all physical tracks in the redundancy group which have the same track address in the common drive format for all the physical disk drives in the logical device. These logical tracks are also organized into logical cylinders, each of which is the collection of all logical tracks within a redundancy group which can be accessed at a common actuator position in the common drive format for all the physical disk drives in the logical device. A disk drive array 100 appears to the host processor to be a collection of large form factor disk drives, each of which contains a predetermined number of tracks of a predetermined size called a virtual track. Therefore, when the host processor 11 transmits data over the data channel 21 to the disk drive array 100, the data is transmitted in the form of the individual records of a virtual track. In order to render the operation of the disk drive array 100 transparent to the host processor 11, the received data is stored on the actual physical disk drives (122-1 to 122-$n+m$) in the form of virtual track instances which reflect the capacity of a track on the large form factor disk drive that is emulated by disk drive array 100. Although a virtual track instance may spill over from one physical track to the next physical track, a virtual track instance is not permitted to spill over from one logical cylinder to another. This is done in order to simplify the management of the memory space.

When a virtual track is modified by the host processor 11, the updated instance of the virtual track is not rewritten in disk drive array 100 at its original location but is instead written to a new logical cylinder and the previous instance of the virtual track is marked obsolete. Therefore, over time a logical cylinder becomes riddled with "holes" of obsolete data known as free space. In order to create whole free logical cylinders, virtual track instances that are still valid and located among fragmented free space within a logical cylinder are relocated within the disk drive array 100 in order to create entirely free logical cylinders. In order to evenly distribute data transfer activity, the tracks of each virtual device are scattered as uniformly as possible among the logical devices in the disk drive array 100. In addition, virtual track instances are padded out if necessary to fit into an integral number of physical device sectors. This is to insure that each virtual track instance starts on a sector boundary of the physical device.

Mapping Tables

It is necessary to accurately record the location of all data within the disk drive array 100 since the data received from the host processors 11-12 is mapped from its address in the virtual space to a physical location in the subsystem in a dynamic fashion. A virtual track directory is maintained to recall the location of the current instance of each virtual track in the disk drive array data storage subsystem 100. The virtual track directory consists of an entry for each virtual track which the associated host processor 11 can address. The entry contains the logical sector address at which the virtual track instance begins. The virtual track directory entry also contains data indicative of the length of the virtual track instance in sectors. The virtual track directory is stored in noncontiguous pieces of the cache memory 113 and is addressed indirectly through pointers in a virtual device table. The virtual track directory is updated whenever a new virtual track instance is written to the disk drives.

The storage control also includes a free space directory (FIG. 8) which is a list of all of the logical cylinders in the disk drive array 100 ordered by logical device. Each logical device is cataloged in a list called a free space list for the logical device; each list entry represents a logical cylinder and indicates the amount of free space that this logical cylinder presently contains. This free space directory contains a positional entry for each logical cylinder; each entry includes both forward and backward pointers for the doubly linked free space list for its logical device and the number of free sectors contained in the logical cylinder. Each of these pointers points either to another entry in the free space list for its logical device or is null. The collection of free space is a background process that is implemented in the disk drive array data storage subsystem 100. The free space collection process makes use of the logical cylinder directory which is a list contained in the first sector of each logical cylinder indicative of the contents of that logical cylinder. The logical cylinder directory contains an entry for each virtual track instance contained within the logical cylinder. The entry for each virtual track instance contains the identifier of the virtual track instance and the identifier of the relative sector within the logical cylinder in which the virtual track instance begins. From this directory and the virtual track directory, the free space collection process can determine which virtual track instances are still current in this logical cylinder and therefore need to be moved to another location to make the logical cylinder available for writing new data.

Data Move/Copy Operation

The data file move/copy operation instantaneously relocates or creates a second instance of a selected data file by merely generating a new set of pointers to reference the same physical memory location as the original set of reference pointers in the virtual track directory. In this fashion, by simply generating a new set of pointers referencing the same physical memory space, the data file can be moved/copied.

This apparatus instantaneously moves the original data file without the time penalty of having to download the data file to the cache memory 113 and write the data file to a new physical memory location. For the purpose of enabling a program to simply access the data file at a different virtual address the use of this mechanism provides a significant time advantage. A physical copy of the original data record can later be written as a background process to a second memory location, if so desired. Alternatively, when one of the programs that can access the data file writes data to or modifies the data file in any way, the modified copy of a portion of the original data file is written to a new physical memory location and the corresponding address pointers are changed to reflect the new location of this rewritten portion of the data file. In this fashion, a data file can be instantaneously moved/copied by simply creating a new set of memory pointers and the actual physical copying of the data file can take place either as a background process or incrementally as necessary when each virtual track of the data file is modified by one of the programs that accesses the data file.

Virtual Track Directory Source and Target Flags

Each entry in the Virtual Track Directory (VTD) contains two flags associated with the Copy/Move function. The "Source" flag is set whenever a Virtual Track Instance at this Virtual Track Address has been the origin of a copy or move. The Virtual Track Instance pointed to by this entry is not necessarily the Source, but the Virtual Track Instance contains this Virtual Address. If the Source flag is set, there is at least one entry in the Copy Table for this Virtual Address. The "Target" flag is set whenever a Virtual Track Instance contains data that has been the destination of a copy or move. If the Target flag is set, the Virtual Address in the Virtual Track Instance that is pointed to is not that of the VTD Entry.

Mapping Table Fail Soft Techniques

It is evident from the above description that the loss of the mapping tables would be catastrophic since the location of the data stored in disk drive array 100 is unknown without accurate mapping tables and therefore the data is effectively lost. Since such an occasion is so catastrophic, the mapping tables are backed up in such a manner as to minimize the impact of a loss of a mapping table. Since the mapping tables are large and are changed on a continuous basis, a totally accurate non-volatile backup copy of the mapping tables is difficult to maintain. The mapping tables are backed up by a pair of alternating fuzzy image copies and a pair of associated change journals. The primary or current copy of the mapping tables is stored in the cache memory 113 while the backup fuzzy image copies are stored on redundancy groups of disk drives 122; the change journals are kept in the non-volatile portion of the cache memory 113. An image copy of a table or a file has traditionally meant a complete sequentially organized copy of all of the file. Therefore a change to the file must be delayed while an image copy is made. In order to eliminate the need for this delay, a fuzzy image copy can be used instead. A fuzzy image copy is an image copy taken while changes are potentially being made to the table or file being copied. In order for the fuzzy image copy to be of any value, a journal of the changes that were made to the file during the time that the image copy was being produced is also stored in a non-volatile memory. Thus, once the fuzzy image copy is produced, the journal of changes can be used to update the fuzzy image copy to be a complete image copy. This produces the correct image of the file as it was at the end of the most recent modifications. The use of two alternating memory areas is necessitated by the fact that when a fuzzy image copy is being updated by the journal of changes, the second memory area stores memory updates occurring during the journal change update process. Therefore, for the mapping table recovery, the change journals are read out of cache memory 113 and used to update the fuzzy image copy of the mapping tables stored on redundancy groups of disk drives 122. As a further memory protection arrangement, each virtual track instance stored on the disks in the disk drive array data storage subsystem 100 is self defining. Each virtual track instance contains the virtual device identifier and the virtual cylinder and head numbers which are all written within the virtual track instance.

Data Read Operation

Figure 6:
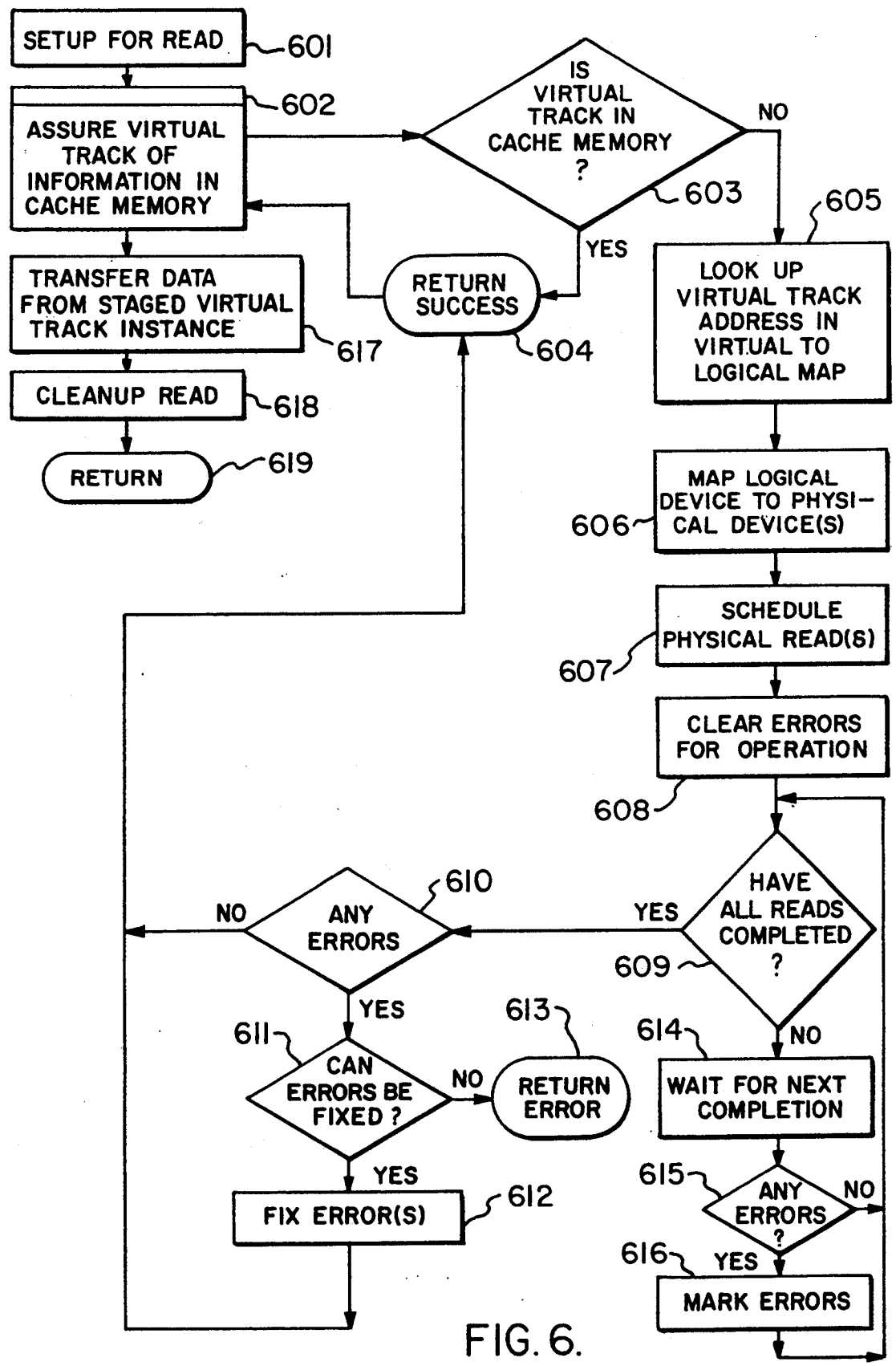
FIGS. 6 and 7 illustrate, in flow diagram form, the operational steps taken to perform a data read and write operation, respectively.

FIG. 6 illustrates in flow diagram form the operational steps taken by processor 204 in control unit 101 of the data storage subsystem 100 to read data from a redundancy group 122-1 to 122-$n+m$ in the disk drive subsets 103. The disk drive array data storage subsystem 100 supports reads of any size. However, the logical layer only supports reads of virtual track instances. In order to perform a read operation, the virtual track instance that contains the data to be read is staged from the logical layer into the cache memory 113. The data record is then transferred from the cache memory 113 and any clean up is performed to complete the read operation.

At step 601, the control unit 101 prepares to read a record from a virtual track. At step 602, the control unit 101 branches to the cache directory search subroutine to assure that the virtual track is located in the cache memory 113 since the virtual track may already have been staged into the cache memory 113 and stored therein in addition to having a copy stored on the plurality of disk drives (122-1 to 122-$n+m$) that constitute the redundancy group in which the virtual track is stored. At step 603, the control unit 101 scans the hash table directory of the cache memory 113 to determine whether the requested virtual track is located in the cache memory 113. If it is, at step 604 control returns back to the main read operation routine and the cache staging subroutine that constitutes steps 605–616 is terminated.

Assume, for the purpose of this description, that the virtual track that has been requested is not located in the cache memory 113. Processing proceeds to step 605 where the control unit 101 looks up the address of the virtual track in the-virtual to logical map table. At step 606, the logical map location is used to map the logical device to one or more physical devices in the redundancy group. If the physical devices in the redundancy group are not uniform in data storage characteristics and/or data storage capacity, the virtual track directory gives the address of a logical device, a logical sector number, and the number of logical sectors required. From this information, the logical to physical mapping tables identify an ordered set of physical devices and the common device format for all the physical devices in the logical device. From the physical drive identifier, the physical drive type and format mapping is produced. At step 607, the control unit 101 schedules one or more physical read operations to retrieve the virtual track instance from appropriate ones of identified physical devices 122-1 to 122-$n+m$. At step 608, the control unit 101 clears errors for these operations. At step 609, a determination is made whether all the reads have been completed, since the requested virtual track instance may be stored on more than one of the N+M disk drives in a redundancy group. If all of the reads have not been completed, processing proceeds to step 614 where the control unit 101 waits for the next completion of a read operation by one of the N+M disk drives in the redundancy group. At step 615 the next reading disk drive has completed its operation and a determination is made whether there are any errors in the read operation that has just been completed. If there are errors, at step 616 the errors are marked and control proceeds back to the beginning of step 609 where a determination is made whether all the reads have been completed. If at this point all the reads have been completed and all portions of the virtual track instance have been retrieved from the redundancy group, then processing proceeds to step 610 where a determination is made whether there are any errors in the reads that have been completed. If errors are detected then at step 611 a determination is made whether the errors can be fixed. One error correction method is the use of a Reed-Solomon error detection/correction code to recreate the data that cannot be read directly. If the errors cannot be repaired then a flag is set to indicate to the control unit 101 that the virtual track instance can not be read accurately. If the errors can be fixed, then in step 612 the identified errors are corrected and processing returns back to the main routine at step 604 where a successful read of the virtual track instance from the redundancy group to the cache memory 113 has been completed.

At step 617, control unit 101 transfers the requested data record from the staged virtual track instance in which it is presently stored. Once the records of interest from the staged virtual track have been transferred to the host processor 11 that requested this information, then at step 618 the control unit 101 cleans up the read operation by performing the administrative tasks necessary to place all of the apparatus required to stage the virtual track instance from the redundancy group to the cache memory 113 into an idle state and control returns at step 619 to service the next operation that is requested.

Data Write Operation

Figure 7:
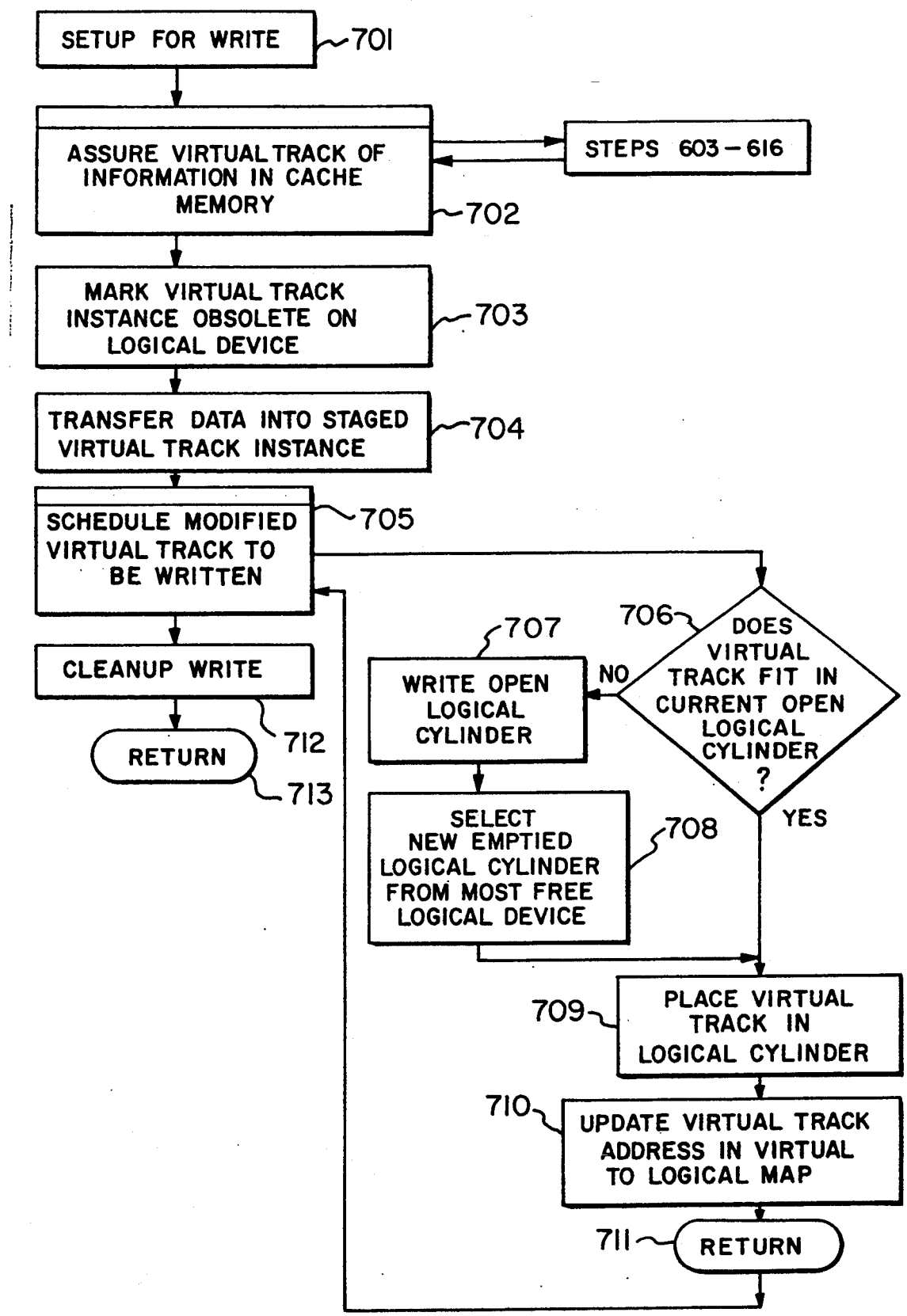

FIG. 7 illustrates in flow diagram form the operational steps taken by the disk drive array 100 to perform a data write operation. The disk drive array 100 supports writes of any size, but again, the logical layer only supports writes of virtual track instances. Therefore in order to perform a write operation, the virtual track that contains the data record to be rewritten is staged from the logical layer into the cache memory 113. Once the write operation is complete, the location of the obsolete instance of the virtual track is marked as free space. The modified data record is then transferred into the virtual track and this updated virtual track instance is then scheduled to be written from the cache memory 113 where the data record modification has taken place into the logical layer. Any clean up of the write operation is then performed once this transfer and write is completed.

At step 701, the control unit 101 performs the set up for a write operation and at step 702, as with the read operation described above, the control unit 101 branches to the cache directory search subroutine to assure that the virtual track into which the data is to be transferred is located in the cache memory 113. Since all of the data updating is performed in the cache memory 113, the virtual track in which this data is to be written must be transferred from the redundancy group in which it is stored to the cache memory 113 if it is not already resident in the cache memory 113, unless the entire virtual track is being rewritten. The transfer of the requested virtual track instance to the cache memory 113 is performed for a write operation as it is described above with respect to a data read operation and constitutes steps 603–616 illustrated in FIG. 6 above.

At step 703, the control unit 101 marks the virtual track instance that is stored in the redundancy group as invalid in order to assure that the logical location at which this virtual track instance is stored is not accessed in response to another host processor 12 attempting to read or write the same virtual track. Since the modified record data is to be written into this virtual track in the cache memory 113, the copy of the virtual track that resides in the redundancy group is now inaccurate and must be removed from access by the host processors 11-12. At step 704, the control unit 101 transfers the modified record data received from host processor 11 into the virtual track that has been retrieved from the redundancy group into the cache memory 113 to thereby merge this modified record data into the original virtual track instance that was retrieved from the redundancy group. Once this merge has been completed and the virtual track now is updated with the modified record data received from host processor 11, the control unit 101 must schedule this updated virtual track instance to be written onto a redundancy group somewhere in the disk drive array data storage subsystem 100.

This scheduling is accomplished by the subroutine that consists of steps 706–711. At step 706, the control unit 101 determines whether the virtual track instance as updated fits into an available open logical cylinder. If it does not fit into an available open logical cylinder, then at step 707 then this presently open logical cylinder must be closed out and written to the physical layer and another logical cylinder selected from the most free logical device or redundancy group in the disk drive array data storage subsystem 100. At step 708, the selection of a free logical cylinder from the most free logical device takes place. This ensures that the data files received from host processor 11 are distributed across the plurality of redundancy groups in the disk drive array data storage subsystem 100 in an even manner to avoid overloading certain redundancy groups while underloading other redundancy groups. Once a free logical cylinder is available, either being the presently open logical cylinder or a newly selected logical cylinder, then at step 709, the control unit 101 writes the updated virtual track instance into the logical cylinder and at step 710 the new location of the virtual track is placed in the virtual to logical map in order to render it available to the host processors 11-12. At step 711, control returns to the main routine, where at step 712 the control unit 101 cleans up the remaining administrative tasks to complete the write operation and return to an available state at 712 for further read or write operations from host processor 11.

Free Space Collection

Figure 8:
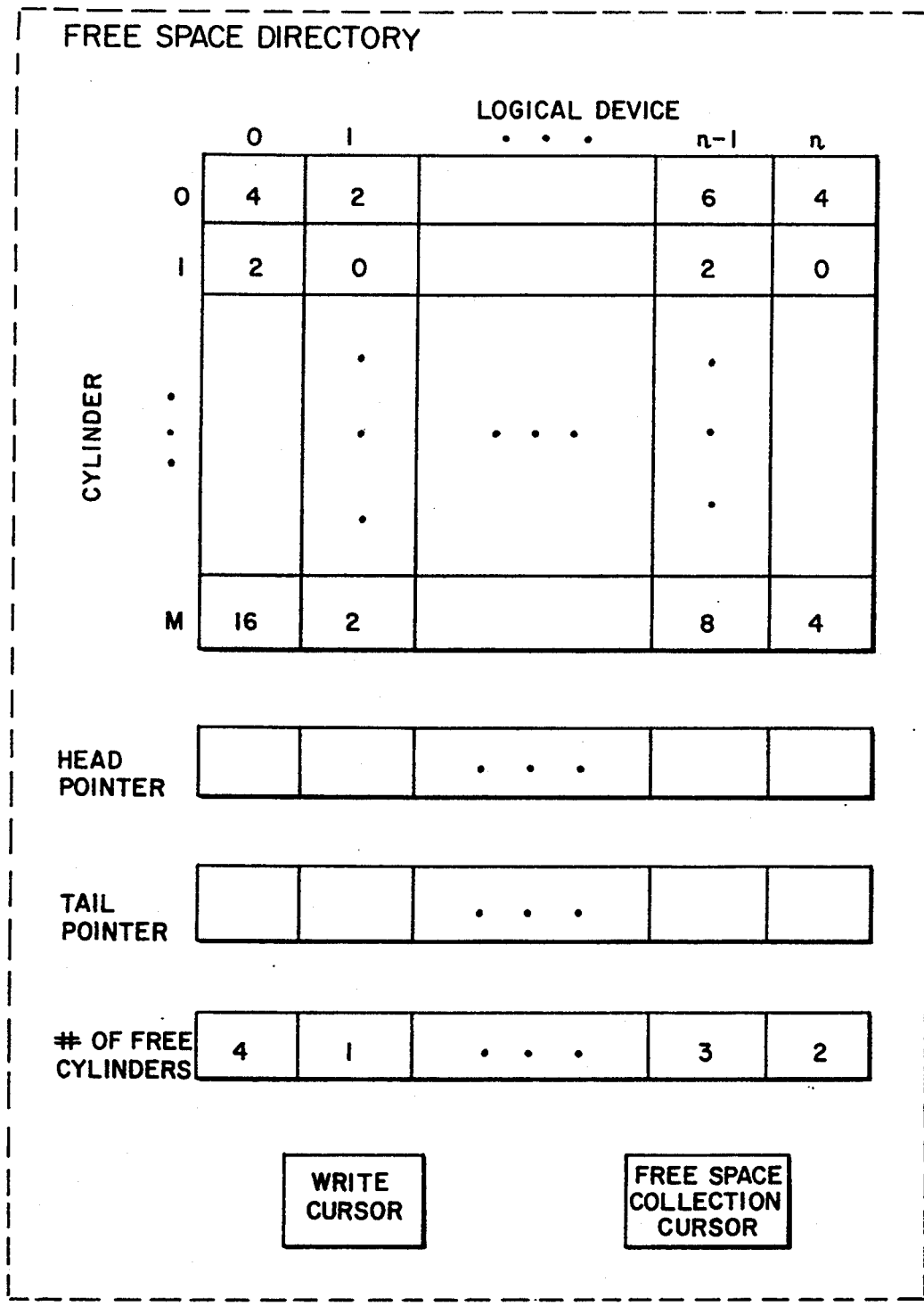
FIG. 8 illustrates a typical free space directory used in the data storage subsystem.

When data in cache memory 113 is modified, it cannot be written back to its previous location on a disk drive in disk drive subsets 103 since that would invalidate the redundancy information on that logical track for the redundancy group. Therefore, once a virtual track has been updated, that track must be written to a new location in the disk drive array 100 and the data in the previous location must be marked as free space. Therefore, in each redundancy group, the logical cylinders become riddled with "holes" of obsolete data in the form of virtual track instances that are marked as obsolete. In order to completely empty logical cylinders for destaging, the valid data in partially valid cylinders must be read into cache memory 113 and rewritten into new previously emptied logical cylinders. This process is called free space collection. The free space collection function is accomplished by control unit 101. Control unit 101 selects a logical cylinder that needs to be collected as a function of how much free space it contains. The free space determination is based on the free space directory as illustrated in FIG. 8, which indicates the availability of unused memory in disk drive array 100. The table illustrated in FIG. 8 is a listing of all of the logical devices contained in disk drive array 100 and the identification of each of the logical cylinders contained therein. The entries in this chart represent the number of free physical sectors of the common drive format for this logical device in this particular logical cylinder. A write cursor is maintained in memory and this write cursor indicates the available open logical cylinder that control unit 101 will write to when data is destaged from cache 113 after modification by associated host processor 11-12 or as part of a free space collection process. In addition, a free space collection cursor is maintained which points to the present logical cylinder that is being cleared as part of a free space collection process. Therefore, control unit 101 can review the free space directory illustrated in FIG. 8 as a background process to determine which logical cylinder on a logical device would most benefit from free space collection. Control unit 101 activates the free space collection process by reading all of the valid data from the selected logical cylinder into cache memory 113 and then to the available open logical cylinder. The logical cylinder is then listed as completely empty, since all of the virtual track instances therein are tagged as obsolete. Additional logical cylinders are collected for free space collection purposes or as data is received from an associated host processor 11-12 until a complete logical cylinder has been filled. Once a complete logical cylinder has been filled, a new previously emptied logical cylinder is chosen.

Figure 9:
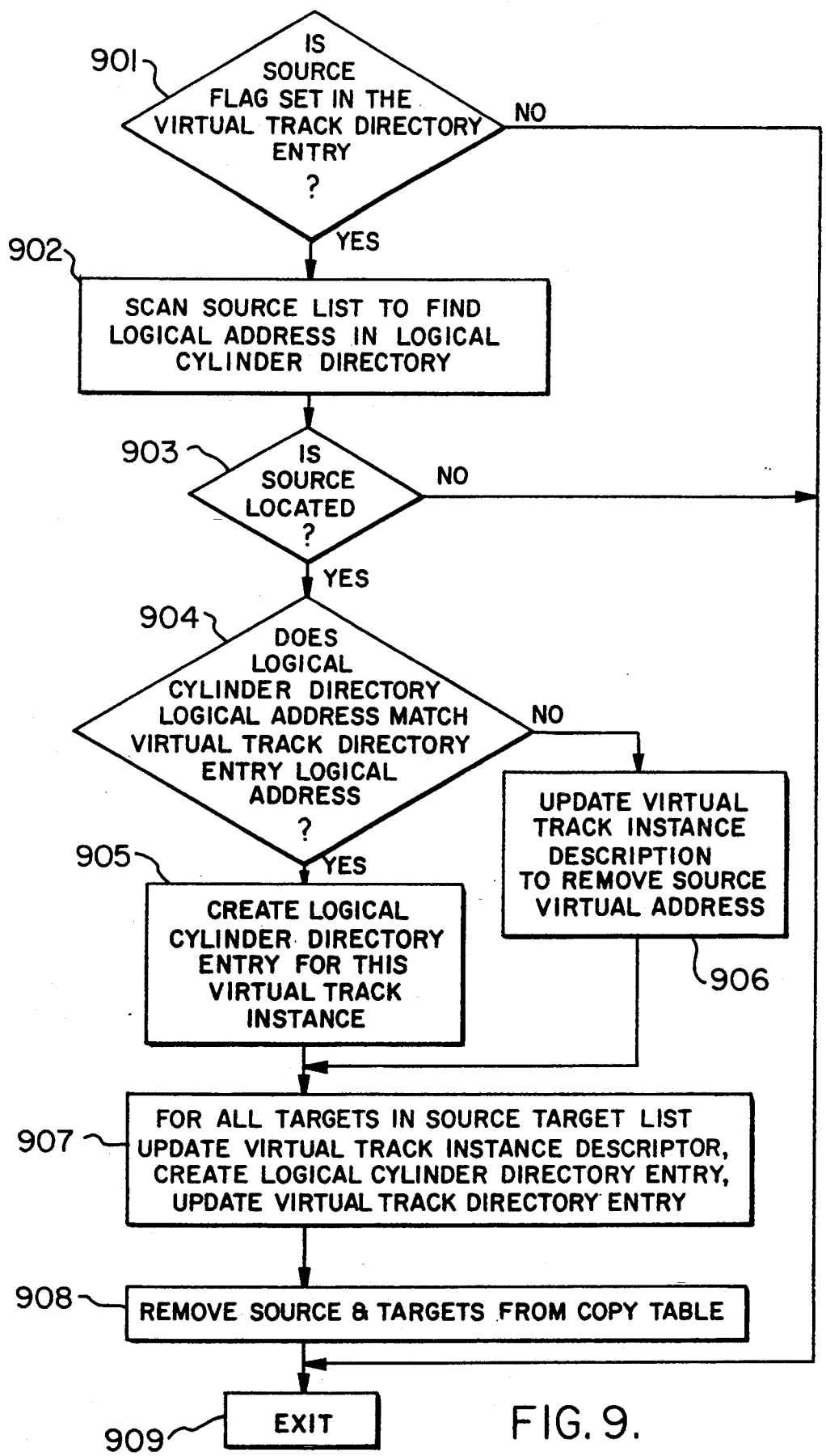
FIG. 9 illustrates, in flow diagram form, the free space collection process.

FIG. 9 illustrates in flow diagram form the operational steps taken by processor 204 to implement the free space collection process. The use of Source and Target Flags is necessitated by the free space collection process since this process must determine whether each virtual track instance contains valid or obsolete data. In addition, the free space collection process performs the move/copy count field adjustment operations listed in the copy linked list. The basic process is initiated at step 901 when processor 204 selects a logical cylinder for collection based on the number of free logical sectors as listed in the table of FIG. 8. Processor 204 checks each virtual track directory entry to determine if the Source Flag is set. If not, the process exists at step 909 to the next logical track. If the Source Flag is set, at step 902 processor 204 scans the source list to find the logical address in the logical cylinder directory. If no address is found, this virtual track instance is an obsolete version and is no longer needed (invalid). This data is not relocated.

If the address is found, at step 904, processor 204 compares the logical cylinder directory logical address with the virtual track directory entry logical address. If there is a match, processor 204 creates a logical cylinder directory entry for this virtual track instance. If there is not a match, the Source has been updated and exists elsewhere. Processor 204 at step 906 updates the virtual track instance descriptor to remove the source virtual address. Upon completion of either step 905 or 906, processor 204 at step 907 for all Targets in this Source's Target List updates the virtual track instance descriptor to include this virtual address and the update count fields flag from the Copy Table. In addition, processor 204 creates a logical cylinder directory entry for this virtual track instance. Finally, processor 204 updates the virtual track directory entry for the Target to point to the new location and to clear the Target Flag. Processor 204 at step 908 removes this Source and all its Targets from the Copy Table. Processor 204 also scans the Copy Table for Sources with the same virtual address and clears the Source Flag. The changes are then journaled to the virtual track directory and to the Copy Table.

Disk Drive Logical to Physical Mapping

The disk drives of data storage subsystem 100 are loosely coupled into redundancy, groups, each containing n+m disk drives. These disk drives need not be identical in type. Disk drives of varying data storage capacity and data storage configuration can be used in a single redundancy group. This is accomplished by mapping all the disk drives in a redundancy group into a common drive format, typically representative of the minimum data storage capacity disk drive in the redundancy group. Control software in control unit 101 queries all disk drives in the redundancy group to identify the cylinder, track and sector format of all the disk drives in the redundancy group. It is possible that one disk drive in the redundancy group has the minimum number of logical sectors/track and a different disk drive in the redundancy group has a minimum number of tracks/drive. Then the common drive format is not the format of either of these disk drives.

Figure 10:
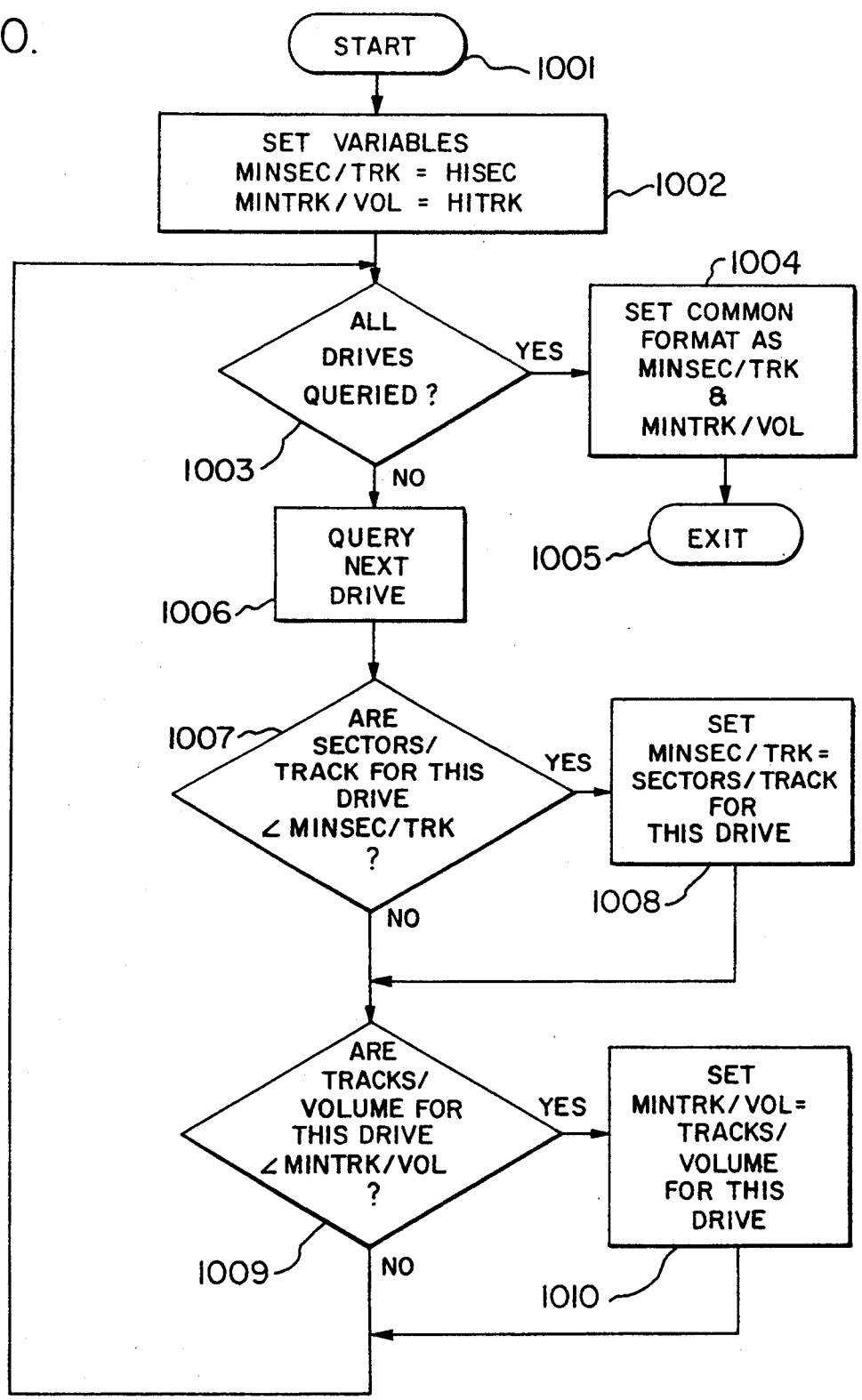
FIG. 10 illustrates in flow diagram form the process used to select the common disk drive format for a redundancy group in the disk drive array data storage subsystem.

The flow diagram of FIG. 10 illustrates the steps taken by control unit 101 to select a common drive format for the disk drives in the redundancy group. The process is initiated at step 1002 where the variables MIN SECTORS/TRK, and MIN TRKS/VOL are each set to a predetermined value: HISEC, HITRK respectively. This enables the control unit 101 to determine the lowest value for the number of sectors/track and tracks/volume and for the disk drives in this redundancy group using steps 1003-1010. At step 1003, control unit 101 checks to determine whether all disk drives in the redundancy group have been checked. If so, at step 1004, the common drive format is established as the values of the variables MIN SECTORS/TRK, MIN TRKS/VOL, and all disk drives in the redundancy group are managed as having the number of sectors per track, tracks per volume as indicated by these variables. Processing exits at step 1005.

If at step 1003, all disk drives in the redundancy group were not checked, at step 1006, the next disk drive in the redundancy group is checked to determine its physical characteristics. At step 1007, control unit 101 checks the number of sectors per track of this disk drive and compares this number with the present value of the variable MIN SECTORS/TRK. If this disk drive contains fewer sectors per track than the value of this variable, at step 1008 the variable MIN SECTORS/TRK is reset to the value representative of this disk drive. Processing then proceeds to steps 1009 and 1010 where a similar determination is made for the number of tracks per volume for this disk drive. Once these queries are completed, processing returns to step 1003.

There can be additional data storage characteristics such as tracks per cylinder, sector size, and data storage capacity that are checked by control unit 101 to establish the common drive format. Alternatively, one of the above-described characteristics may not be checked since it is uniform for all disk drives in the redundancy group as a result of design choice. The corresponding selection steps are therefore redundant and may be bypassed as a result of user activated software options.

The virtual disk drive having the minimum number of tracks/volume and sectors/track is selected at step 1005 to be the common drive format. The number of possible cylinders per disk for the common format disk drive is also computed using the selected track and sector numbers at step 1006 to create the common drive format template. The resultant template is used to map the physical tracks of all disk drives in the redundancy group to the common drive format. Each logical track is made up of one physical track of each disk drive in the redundancy group, but the address of each physical track is a function of the size and format of the associated disk drive.

An example of a three disk drive redundancy group is:

| Drive Type | Track Length | Tracks/ Cylinder | Cylinders | Total Tracks |
|---|---|---|---|---|
| 1 | 20 Sectors | 16 | 1250 | 20,000 |
| 2 | 20 Sectors | 15 | 1345 | 20,175 |
| 3 | 19 Sectors | 20 | 1024 | 20,480 |

-continued

Preferred drive configuration (track remapping):

| New | 19 Sectors | 15 | 1333 | 19,995 |
|---|---|---|---|---|

| | | |
|---|---|---|
| Type 1: | Last sector on each track is unused | |
| | Logical Cylinder 0 | → Cyl 0, Track 0 thru Track 14 |
| | Logical Cylinder 1 | → Cyl 0, Track 15 and Cyl 1, Track 0 thru Track 13 |
| | Logical Cylinder 2 | → Cyl 1, Track 14 thru Track 15 and Cyl 2, Track 0 thru Track 12 |
| | Logical Cylinder 3 | → Cyl 2, Track 13 thru Track 15 and Cyl 3, Track 0 thru Track 11 |
| | . . . | |
| | Logical Cylinder 1331 | → Cyl 1247, Track 11 thru Track 15 and Cyl 1248, Track 0 thru Track 11 |
| | Logical Cylinder 1332 | → Cyl 1248, Track 12 thru Track 15 and Cyl 1249, Track 0 thru Track 10 |
| Type 2: | Last sector on each track is unused | |
| | Logical Cylinder 0 | → Cyl 0 |
| | Logical Cylinder 1 | → Cyl 1 |
| | . . . | |
| | Logical Cylinder 1332 | →Cyl 1332 |
| Type 3: | Logical Cylinder 0 | → Cyl 0, Track 0 thru Track 14 |
| | Logical Cylinder 1 | → Cyl 0, Track 15 thru Track 19 and Cyl 1, Track 0 thru Track 9 |
| | Logical Cylinder 2 | → Cyl 1, Track 10 thru Track 19 and Cyl 2, Track 0 thru Track 4 |
| | Logical Cylinder 3 | → Cyl 2, Track 5 thru Track 19 |
| | . . . | |
| | Logical Cylinder 1331 | → Cyl 998, Track 0 thru Track 14 |
| | Logical Cylinder 1332 | → Cyl 998, Track 15 thru Track 19 and Cyl 999, Track 0 thru Track 14 |

Thus, the control software maintains data indicative of the data storage capacity of the redundancy group. This data includes an identification of the mapping of logical to physical tracks for each disk drive in the redundancy group. This system automatically compensates for variation in data storage capacity and data storage configuration among the disk drives in data storage subsystem 100. Thus, the disk drives in data storage subsystem 100 can be upgraded in data storage capacity without requiring any modification to data storage subsystem 100. Also, any compatible spare disk drive, which has a capacity at least as large as that of the common drive format for the redundancy group, can be inserted into data storage subsystem 100, which automatically adjusts to the data storage configuration of this new disk drive. This description of the invention is provided in the context of a disk drive array but it is obvious that this adaptable self-configuring capability can be used in different applications wherein a plurality of disk drives are used to provide a data storage capability. While a specific embodiment of this invention has been disclosed herein, it is expected that those skilled in the art can design other embodiments that differ from this particular embodiment but fall within the scope of the appended claims.

We claim:

1. A data storage system, having a plurality of disk drives each having a single set of at least two predefined data storage characteristics, for storing data records for at least one associated data processor, comprising:
   a controller, responsive to one of said disk drives having at least one of said at least two data storage characteristics different than a corresponding one of said at least two data storage characteristics of the remaining ones of said plurality of disk drives, for selecting a common disk drive format comprising a set of said data storage characteristics that are emulatable by all of said plurality of disk drives, comprising;
   means for selecting at least one of said data storage characteristics,
   means for querying each said disk drive to determine a disk drive format, corresponding to said selected data storage characteristics, implemented on each of said disk drives,
   means for selecting a disk drive format, corresponding to said selected data storage characteristic, that is emulatable by each of said disk drives;
   means for configuring said plurality of disk drives to match said selected common disk drive format; and
   means, responsive to the receipt of a stream of data records from said associated data processor, for writing said received stream of data records in available memory space in one of said disk drives.

2. The system of claim 1 further comprising:
   means for querying all said disk drives to determine said data storage characteristics of each of said disk drives.

3. The system of claim 1 wherein said selecting means includes:
   means for generating a template indicative of data storage characteristics commonly emulatable by said plurality of disk drives.

4. The system of claim 3 wherein said configuring means includes:
   means for storing data indicative of the mapping of the physical tracks of each of said disk drives to said template.

5. The system of claim 1 further comprising:
   means, responsive to the subsequent receipt of modifications to one of said data records stored in one of said disk drives from said associated data processor, for writing said modified data record in available memory space in one of said disk drives; and
   means for converting said memory space used to store said originally received data record to available memory space.

6. The system of claim 1 further comprising:
   means for reserving at least one of said disk drives as backup disk drives, which backup disk drives are shared in common by the remaining ones of said disk drives;
   means for identifying one of said disk drives that fails to function; and
   means for switchably connecting one of said backup disk drives in place of said identified failed disk drive.

7. The system of claim 6 wherein said configuring means is responsive to said backup disk drive being switched in place of said identified failed disk drive for configuring said backup disk drive to match the configuration of said identified failed disk drive.

8. The system of claim 1 wherein said selecting means includes:
   means for selecting the number of sectors per track in said common disk drive format to match the disk drive in said plurality of disk drives having the lowest number of sectors per track.

9. The system of claim 1 wherein said selecting means includes:
   means for selecting the number of tracks per volume in said common disk drive format to match the disk drive in said plurality of disk drives having the lowest number of tracks per volume.

10. The system of claim 1 further including:
    means for maintaining data indicative of the correspondence between each said received stream of data records and the identity of the one of said disk drives on which said received stream of data records is stored.

11. The system of claim 10 further including:
    means for maintaining data indicative of the correspondence between each said received stream of data records and the identity of the physical location of said data record on said one disk drive on which said received stream of data records is stored.

12. The system of claim 11 further including:
    means for maintaining data indicative of the mapping of said common disk drive format to the physical characteristics of said one disk drive.

13. In a data storage system having a plurality of disk drives, each having a single set of at least two predefined data storage characteristics, a method for storing data records for at least one associated data processor comprising the steps of:
    selecting, in response to one of said plurality of disk drives having at least one of said at least two data storage characteristics different than a corresponding one of said at least two data storage characteristics of the remaining ones of said plurality of disk drives, a common disk drive format comprising a set of said data storage characteristics that are emulatable by all of said plurality of disk drives, comprising:
    selecting at least one of said data storage characteristics,
    querying each said disk drive to determine a disk drive format, corresponding to said selected data storage characteristic, implemented on each of said disk drives,
    selecting a disk drive format, corresponding to said selected data storage characteristic, that is emulatable by each of said disk drives;
    configuring said disk drives to match said common disk drive format; and
    writing, in response to the receipt of a stream of data records from said associated data processor, said received stream of data records in available memory space in one of said plurality of disk drives.

14. The method of claim 13 further comprising the step of:

querying all said disk drives to determine the data storage characteristics of each of said disk drives.

15. The method of claim 13 wherein said step of selecting includes:

generating a template indicative of data storage characteristics commonly emulatable by all said plurality of disk drives.

16. The method of claim 15 wherein the step of configuring includes:

storing data indicative of the mapping of the physical tracks of each of said disk drives to said template.

17. The method of claim 13 further comprising the steps of:

writing, in response to the subsequent receipt of modifications to one of said data records stored in said disk drives from said associated data processor, said modified data record in available memory space in one of said disk drives; and converting said memory space used to store said originally received data record to available memory space.

18. The method of claim 13 further comprising the steps of:

reserving at least one of said plurality of disk drives as backup disk drives, which backup disk drives are shared in common by the remaining ones of said disk drives;

identifying one of said disk drives that fails to function; and switchably connecting one of said backup disk drives in place of said identified failed disk drive.

19. The method of claim 18 wherein said step of configuring includes configuring, in response to said backup disk drive being switched in place of said identified failed disk drive, said backup disk drive to match the configuring of said failed disk drive.

20. The method of claim 13 wherein the step of selecting includes:

selecting the number of sectors per track in said common disk drive format to match the disk drive in said plurality of disk drives having the lowest number of sectors per track.

21. The method of claim 13 wherein said step of selecting includes:

selecting the number of tracks per volume in said common disk drive format to match the one of said disk drives in said plurality of disk drives that has the lowest number of tracks per volume.

22. The method of claim 13 further including the step of:

maintaining data indicative of the correspondence between each said received stream of data records and the identity of the one of said disk drives on which said received stream of data records is stored.

23. The method of claim 22 further including the step of:

maintaining data indicative of the correspondence between each said received stream of data records and the identity of the physical location of said data record on each of said plurality of disk drives on which said received stream of data records is stored.

24. The method of claim 23 further including the step of:

maintaining data indicative of the mapping of said common disk drive format to the physical characteristics of said one disk drive.

25. A disk memory system for storing data records that are accessible by at least one associated data processor, comprising:

a plurality of disk drives, each having a single set of at least two predefined data storage characteristics, for storing data thereon, a number of said disk drives being configured into at least two redundancy groups, each said redundancy group including n+m of said plurality of disk drives, where n and m are both positive integers with n greater than 1 and m equal to or greater than 1;

a controller, responsive to one of said disk drives in said redundancy group having at least one of said at least two data storage characteristics different than a corresponding one of said at least two data storage characteristics of the remaining disk drives in said redundancy group, for selecting a common disk drive format comprising a set of said data storage characteristics that are emulatable by all said disk drives in said redundancy group, comprising means for selecting at least one of said data storage characteristics, means for querying each said disk drive to determine a disk drive format, corresponding to said selected data storage characteristic, implemented on each of said disk drives, means for selecting a disk drive format, corresponding to said selected data storage characteristic, that is emulatable by each of said disk drives;

means for configuring all said disk drives in said redundancy group to match said common disk drive format;

means for storing each stream of data records received from said associated data processing devices on successive ones of said n disk drives in a selected redundancy group;

means, responsive to said storing means storing streams of data records on all n disk drives in said selected redundancy group, for generating m segments of redundancy information for said data records stored on said n disk drives; and means for writing said m segments of redundancy information on to said m disk drives of said selected redundancy group.

26. The system of claim 25 further comprising:

means for querying all said disk drives in said redundancy group to determine said data storage characteristics of each of said disk drives.

27. The system of claim 25 wherein said selecting means includes:

means for generating a template indicative of data storage characteristics commonly emulatable by all said disk drives in said redundancy group.

28. The system of claim 27 wherein said configuring means includes:

means for storing data indicative of the mapping of the physical tracks of each disk drive in said redundancy group to said template.

29. The apparatus of claim 25 wherein said system further comprises:

means, responsive to the subsequent receipt of modifications to one of said data records stored in one of said redundancy groups from said associated data processor, for writing said modified data record in available memory space in one of said redundancy groups; and means for converting said memory space used to store said originally received data record to available memory space.

30. The system of claim 25 further comprising:

means for reserving at least one of said plurality of disk drives as backup disk drives, which backup disk drives are shared in common by said redundancy groups;

means for identifying one of said disk drives in one of said redundancy groups that fails to function; and means for switchably connecting one of said backup disk drives in place of said identified failed disk drive.

31. The system of claim 30 wherein said configuring means is responsive to said backup disk drive being switched in place of said identified failed disk drive for configuring said backup disk drive to match the configuring of the disk drives in said redundancy group.

32. The system of claim 25 wherein said selecting means includes:

means for selecting the number of sectors per track in said common disk drive format to match the disk drive in said redundancy group having the lowest number of sectors per track.

33. The system of claim 25 wherein said selecting means includes:

means for selecting the number of tracks per volume in said common disk drive format to match the disk drive in said redundancy group having the lowest number of tracks per volume.

34. The system of claim 25 further including:

means for maintaining data indicative of the correspondence between each said received stream of data records and the identity of the one of said disk drives in said selected redundancy group on which said received stream of data records is stored.

35. The system of claim 34 further including:

means for maintaining data indicative of the correspondence between each said received stream of data records and the identity of the physical location of said data record on each of said plurality of disk drives in said selected redundancy group on which said received stream of data records is stored.

36. The system of claim 35 further including:

means for maintaining data indicative of the mapping of said common disk drive format to the physical characteristics of said one disk drive.

37. In a disk memory system having a plurally, of disk drives, each having a single set of at least two predefined data storage characteristics, for storing data thereon, a method of storing data records that are accessible by at least one associated data processor comprising the steps of:

configuring a number of said disk drives into at least two redundancy groups, each said redundancy group including n+m of said plurality of disk drives, where n and m are both positive integers with n greater than 1 and m equal to or greater than 1;

selecting, in response to one of said disk drives in said redundancy group having at least one of said at least two data storage characteristics different than a corresponding one of said at least two data storage characteristics of the remaining disk drives in said redundancy group, a common disk drive format comprising a set of said data storage characteristics that are emulatable by all said disk drives in said redundancy group, comprising;

selecting at least one of said data storage characteristics, querying each said disk drive to determine a disk drive format, corresponding to said selected data storage characteristic, implemented on each of said disk drives, selecting a disk drive format, corresponding to said selected data storage characteristic, that it emulatable by each of said disk drives;

configuring all said disk drives in said redundancy group to match said common disk drive format;

storing each stream of data records received from said associated data processing devices on successive ones of said n disk drives in a selected redundancy group;

generating, in response to storing streams of data records on all n disk drives in said selected redundancy group, m segments of redundancy information for said data records stored on said n disk drives; and writing said m segments of redundancy information on to said m disk drives of said selected redundancy group.

38. The method of claim 37 further comprising the step of:

querying all said disk drives in said redundancy group to determine the data storage characteristics of each of said disk drives.

39. The method of claim 37 wherein said step of selecting includes:

generating a template indicative of data storage characteristics commonly emulatable by all said disk drives in said redundancy group.

40. The method of claim 37 wherein said step of configuring includes:

storing data indicative of the mapping of the physical tracks of each disk drive in said redundancy group to said template.

41. The method of claim 37 further comprising the steps of:

writing, in response to the subsequent receipt of modifications to one of said data records stored in one of said redundancy groups from said associated data processor, said modified data record in available memory space in one of said redundancy groups; and converting said memory space used to store said originally received data record to available memory space.

42. The method of claim 41 further comprising the steps of:

reserving at least one of said plurality of disk drives as backup disk drives, which backup disk drives are shared in common by said redundancy groups;

identifying one of said disk drives in one of said redundancy groups that fails to function; and switchably connecting one of said backup disk drives in place of said identified failed disk drive.

43. The method of claim 42 wherein said step of configuring includes configuring, in response to said backup disk drive being switched in place of said identified failed disk drive, said backup disk drive to match the configuring of the disk drives in said redundancy group.

44. The method of claim 37 wherein the step of selecting includes:
   selecting the number of sectors per track in said common disk drive format to match the one of said disk drives in said redundancy group having the lowest number of sectors per track.

45. The method of claim 37 wherein said step of selecting includes:
   selecting the number of tracks per volume in said common disk drive format to match the one of said disk drives in said redundancy group having the lowest number of tracks per volume.

46. The method of claim 37 further including the step of:
   maintaining data indicative of the correspondence between each said received stream of data records and the identity of the one of said disk drives in said selected redundancy group on which said received stream of data records is stored.

47. The method of claim 46 further including the step of:
   maintaining data indicative of the correspondence between each said received stream of data records and the identity of the physical location of said data record on each of said plurality of disk drives in said selected redundancy group on which said received stream of data records is stored.

48. The method of claim 37 further including the step of:
   maintaining data indicative of the mapping of said common disk drive format to the physical characteristics of said one disk drive.

* * * * *